United States Patent
Rostoker et al.

(10) Patent No.: US 9,110,857 B1
(45) Date of Patent: Aug. 18, 2015

(54) SYSTEMS AND METHODS FOR IDENTIFYING AND COMPRESSING RARELY USED DATA

(71) Applicant: SanDisk Technologies Inc., Plano, TX (US)

(72) Inventors: Tal Rostoker, Kfar Vradim (IL); Alon Marcu, Tel Mond (IL)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/288,992

(22) Filed: May 28, 2014

(51) Int. Cl.
  *G06F 12/00* (2006.01)
  *G06F 13/00* (2006.01)
  *G06F 13/28* (2006.01)
  *G06F 13/16* (2006.01)
  *G11C 7/10* (2006.01)
  *G06F 3/06* (2006.01)
  *G06F 12/02* (2006.01)
  *H01L 27/06* (2006.01)

(52) U.S. Cl.
  CPC .......... *G06F 13/1657* (2013.01); *G06F 3/0608* (2013.01); *G06F 3/0638* (2013.01); *G06F 3/0688* (2013.01); *G06F 12/0246* (2013.01); *G11C 7/1072* (2013.01); *H01L 27/0688* (2013.01); *G06F 2212/1044* (2013.01); *G06F 2212/214* (2013.01); *G06F 2212/401* (2013.01)

(58) Field of Classification Search
  CPC ... G06F 3/0608; G06F 3/0638; G06F 3/0688; G06F 12/0246; G06F 2212/1044; G06F 2212/214; G06F 2212/401; H01L 27/0688
  USPC .......................................... 711/103, 104, 154
  See application file for complete search history.

(56) References Cited

U.S. PATENT DOCUMENTS

| | | | |
|---|---|---|---|
| 8,187,936 B2 | 5/2012 | Alsmeier et al. | |
| 2006/0101084 A1* | 5/2006 | Kishi et al. | 707/200 |
| 2008/0307191 A1* | 12/2008 | Lane et al. | 711/209 |
| 2009/0019215 A1* | 1/2009 | Lee et al. | 711/103 |
| 2010/0169545 A1* | 7/2010 | Lee | 711/103 |
| 2011/0302352 A1* | 12/2011 | Lee et al. | 711/102 |

OTHER PUBLICATIONS

Application as Filed for U.S. Appl. No. 14/133,979, filed Dec. 19, 2013, 121 pages.
Application as Filed for U.S. Appl. No. 14/136,103, filed Dec. 20, 2013, 56 pages.

(Continued)

*Primary Examiner* — Cheng-Yuan Tseng
*Assistant Examiner* — Rocio Del Mar Perez-Velez
(74) *Attorney, Agent, or Firm* — Brinks Gilson & Lione

(57) ABSTRACT

Systems and methods are disclosed for identifying and compressing rarely used data. A storage module may include a memory and a storage controller in operative communication with the memory. The storage controller is configured to identify an access of data stored at a first portion of the memory; determine, based on a first value of the access counter associated with the identified access and a second value of the access counter, that an age of the data stored at the first portion of the memory exceeds a threshold; identify data stored at a second portion of the memory that is associated with a third value of the access counter, where the third value of the access counter is within a range of the first value of the access counter; and compress together at least the data stored at the first and second portions of the memory.

19 Claims, 8 Drawing Sheets

(56) References Cited

OTHER PUBLICATIONS

Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.

Arya, P., "A Survey of 3D Nand Flash Memory", *EECS Int'l Graduate Program, National Chiao Tung University*, 2012, pp. 1-11.

Nowak, E. et al., "Intrinsic Fluctuations in Vertical NAND Flash Memories", *2012 Symposium on VLSI Technology Digest of Technical Papers*, 2012, pp. 21-22.

\* cited by examiner

SYSTEMS AND METHODS FOR IDENTIFYING AND COMPRESSING RARELY USED DATA

BACKGROUND

Memory manufactures often utilize data compression in order to store more data on less silicon. One of the challenges in compressing data is identifying data that should be compressed together. A storage controller is able to obtain better compression ratios when compressing large blocks of data together. However, this may create inefficiencies when a storage controller needs to read data from only a small portion of the blocks of data that were compressed together. In instances like these, the storage controller would need to read the entire compressed block from memory and decompress the entire block before reading the required data. Accordingly, improved systems and methods for identifying and compressing rarely used blocks of data that may be efficiently compressed together are desirable.

SUMMARY

The present disclosure is directed to systems and methods for identifying and compressing rarely used data. In a first aspect, a method is disclosed. The elements of the method are performed in a storage controller of a storage module having a first memory in operation communication with the storage controller.

The storage controller identifies an access of data stored at a first portion of the first memory and stores an association between the access of the data stored at the first portion of the first memory and a first value of an access counter that is associated with the storage module.

The storage controller determines, based on the stored first value of the access counter and a second value of the access counter, that an age of the data stored at the first portion of the first memory exceeds a threshold and identifies data stored at a second portion of the first memory that is associated with a third value of the access counter, where the third value of the access counter is within a range of the first value of the access counter.

The storage controller compresses together at least the data stored at the first portion of the first memory and the data stored at the second portion of the first memory, and stores in the first memory the compressed data of at least the data stored at the first portion of the first memory and the data stored at the second portion of the first memory.

In the storage module, the first memory comprises a silicon substrate and a plurality of memory cells forming at least two memory layers vertically disposed with respect to each other to form a monolithic three-dimensional structure, wherein at least one memory layer is vertically disposed with respect to the silicon substrate.

In another aspect, a storage module is disclosed. The storage module includes a memory and a storage controller in operative communication with the memory. The storage controller is configured to identify an access of data stored at a first portion of the memory and to store an association between the access of the data stored at the first portion of the first memory and a first value of an access counter that is associated with the storage module.

The storage controller is further configured to determine, based on the stored first value of the access counter and a second value of the access counter, that an age of the data stored at the first portion of the first memory exceeds a threshold. The storage controller is configured to identify data stored at a second portion of the first memory that is associated with a third value of the access counter, where the third value of the access counter is within a range of the first value of the access counter.

The storage controller is additionally configured to compress together at least the data stored at the first portion of the first memory and the data stored at the second portion of the first memory and to store in the first memory the compressed data of at least the data stored at the first portion of the first memory and the data stored at the second portion of the first memory.

In the storage module, the first memory comprises a silicon substrate and a plurality of memory cells forming at least two memory layers vertically disposed with respect to each other to form a monolithic three-dimensional structure, wherein at least one memory layer is vertically disposed with respect to the silicon substrate.

DETAILED DESCRIPTION OF THE DRAWINGS

The present disclosure is directed to storage modules that provide the ability to identify and compress rarely used data. The described storage modules may monitor a host and/or a storage controller of the storage module accessing data stored in the storage module and identify rarely used data based on factors such as a number of times the host or the storage controller accesses data stored in the storage module without accessing data stored at a particular portion of the memory or a number of time a storage module exits and enters a hibernation state or a power off state (a power cycle) without the host or the storage controller accessing data stored at a particular portion of the memory.

When the storage module identifies rarely accessed data, the storage module may identify one or more blocks of data stored at other portions of the memory that are rarely used. The storage controller may identify the one or more blocks of data stored at other locations that are rarely used by identifying data stored at memory locations that were last accessed at approximately the same time as the originally identified rarely used data.

Figure 1:
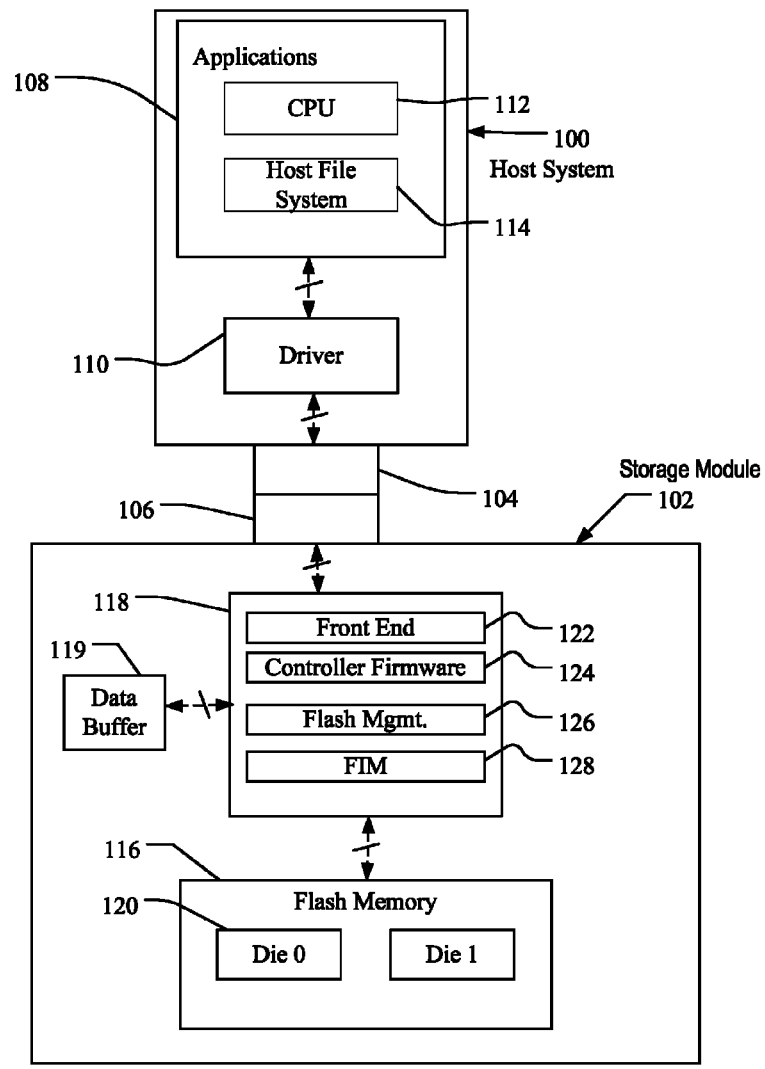
FIG. 1 illustrates a host connected with a storage module having a multi-bank non-volatile memory containing multiple die that may implement the disclosed methods for identifying and compressing rarely used data.

A storage module suitable for use in implementing aspects of the invention is shown in FIGS. 1-6. A host system 100 of FIG. 1 stores data into and retrieves data from a storage module 102. The storage module may be, for example, flash memory embedded within the host, such as in the form of a solid state disk (SSD) drive installed in a personal computer or an iNAND installed in a device. Alternatively, the storage module 102 may be in the form of a card, for example, that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the storage module 102 internal to the host. SSD drives may be in the form of discrete modules that are drop-in replacements for rotating magnetic disk drives.

The host system 100 of FIG. 1 may be viewed as having two major parts, in so far as the storage module 102 is concerned, made up of a combination of circuitry and software. They are an applications portion 108 and a driver portion 110 that interface with the storage module 102. In a PC, for example, the applications portion 108 can include a processor 112 running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The storage module 102 of FIG. 1 may include non-volatile memory, such as flash memory 116; a storage controller 118 that both interfaces with the host 100 to which the storage module 102 is connected for passing data back and forth and controls the memory 116; and one or more data buffers 119 coupled with the storage controller 118 that the storage controller 118 utilizes to buffer data before storing the data to the flash memory 116. The storage controller 118 may convert between logical addresses of data used by the host 100 and physical addresses of the flash memory 116 during data programming and reading. The flash memory 116 may include any number of memory die 120 and two memory die are shown in FIG. 1 simply by way of illustration.

Functionally, the storage controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
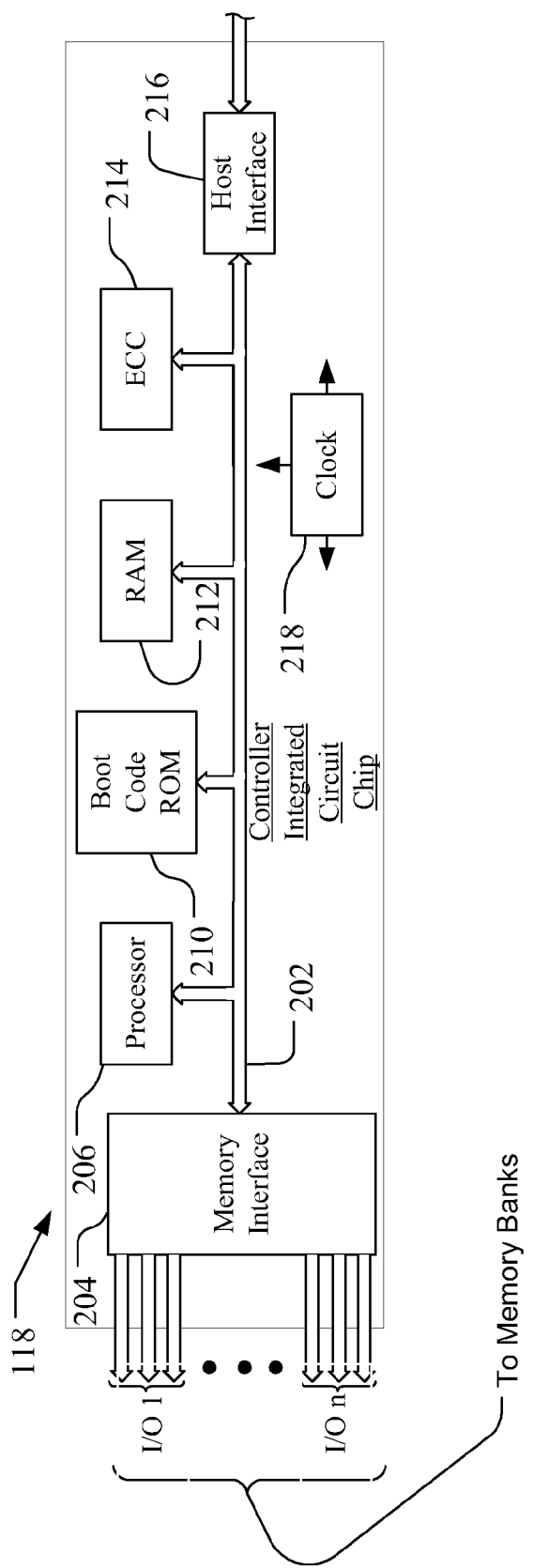
FIG. 2 is an example block diagram of an example flash storage controller for use in the multiple die non-volatile memory of FIG. 1.

The storage controller 118 may be implemented on a single integrated circuit chip, such as an application specific integrated circuit (ASIC) such as shown in FIG. 2. The processor 206 of the storage controller 118 may be configured as a multi-core and multi-thread processor capable of communicating separately with each of the respective memory banks 120 via a memory interface 204 having I/O ports for each of the respective banks 120 in the flash memory 116. The storage controller 118 may include an internal clock 218. The processor 206 communicates with an error correction code (ECC) module 214, a RAM buffer 212, a host interface 216, and boot code ROM 210 via an internal data bus 202.

Figure 3:
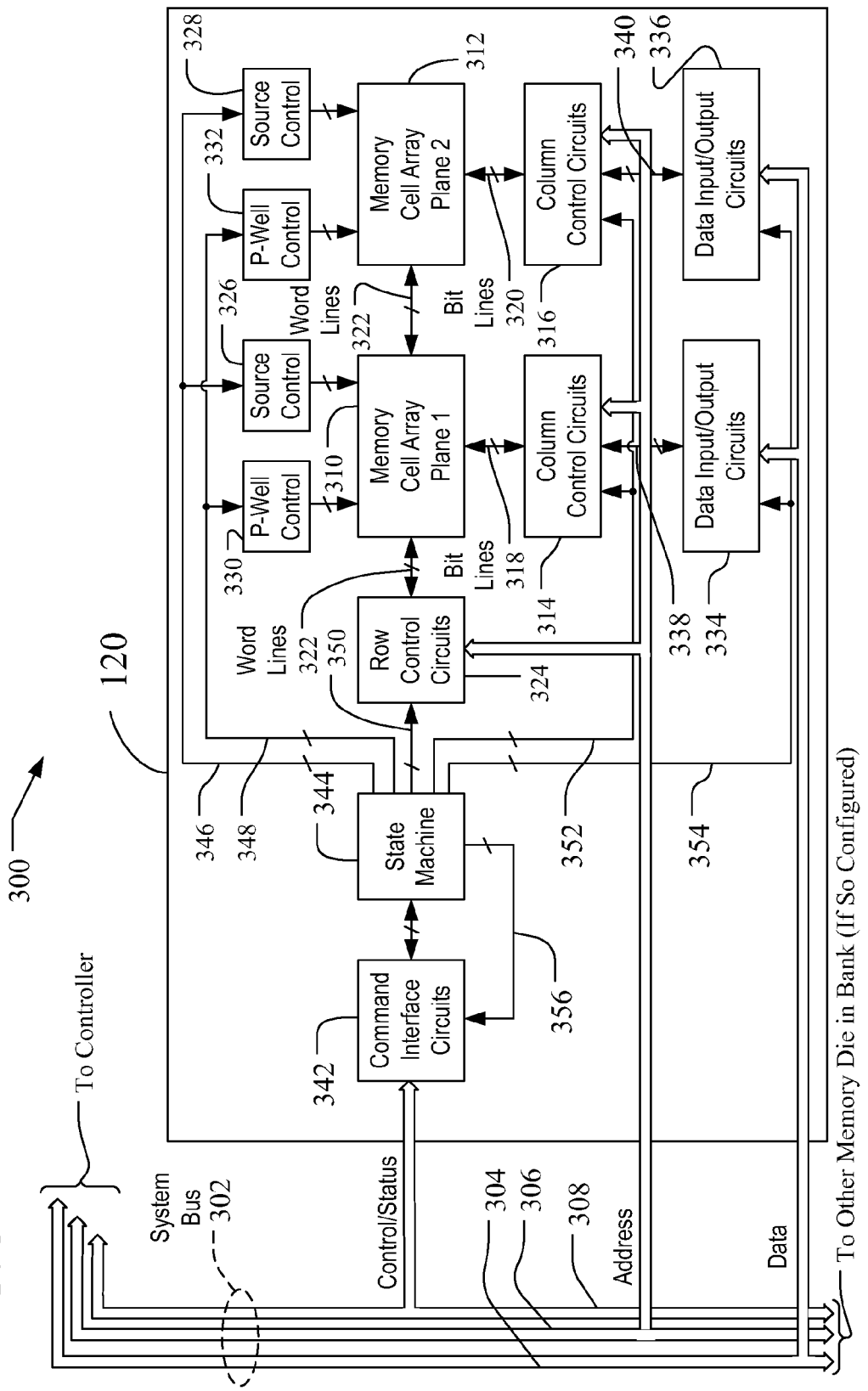
FIG. 3 is an example flash memory bank suitable as one of the non-volatile memory banks illustrated in FIG. 1.

Each die 120 in the flash memory 116 may contain an array of memory cells organized into multiple planes. FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 306. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the storage controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4a for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4A:
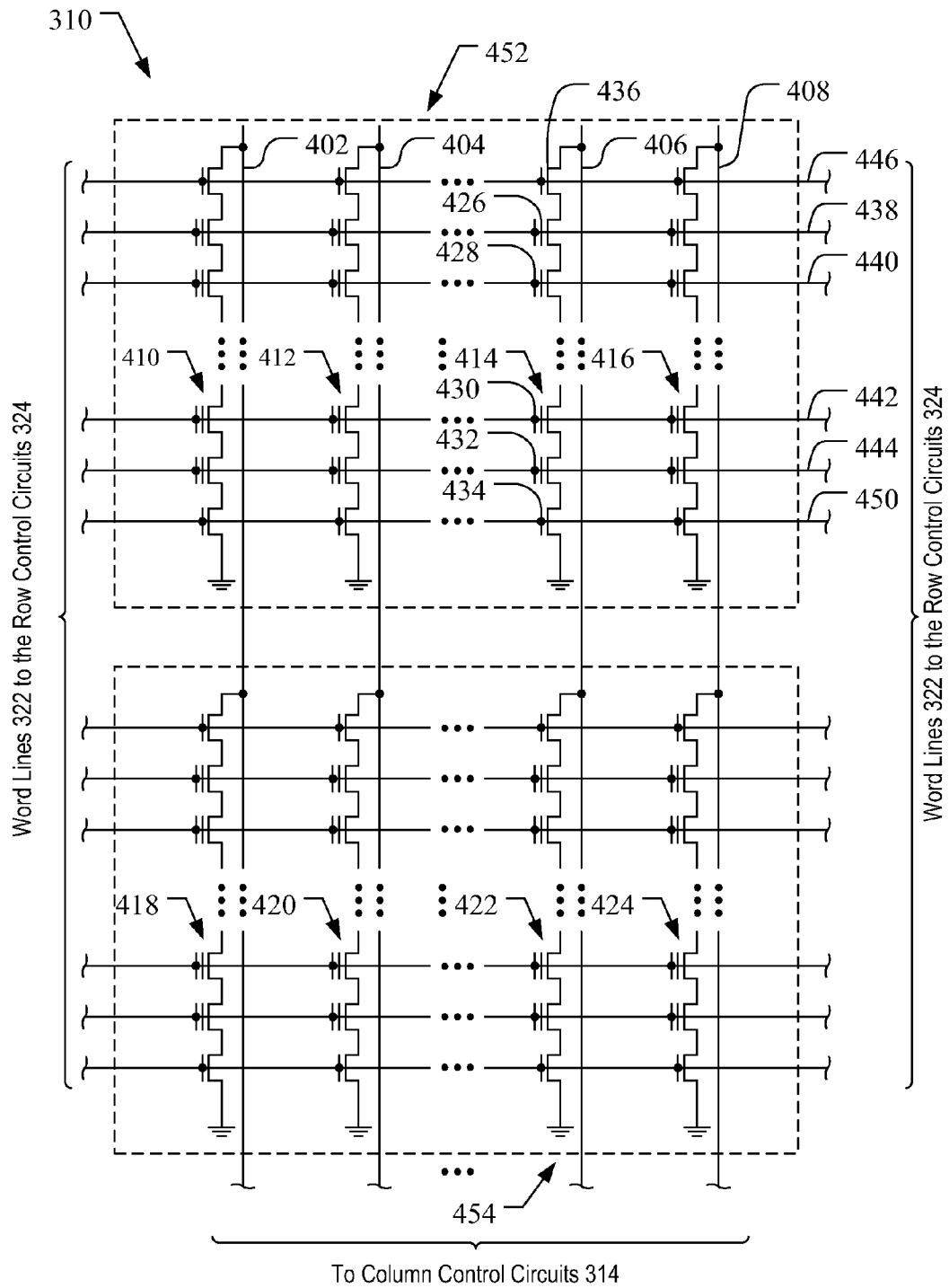
FIG. 4a is a representative circuit diagram of a memory cell array that may be used in the memory bank of FIG. 3.

Word lines 438-444 of FIG. 4a individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. However, in other implementations, the rows of a NAND array are not programmed in sequential order.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory. For example, binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 4B:
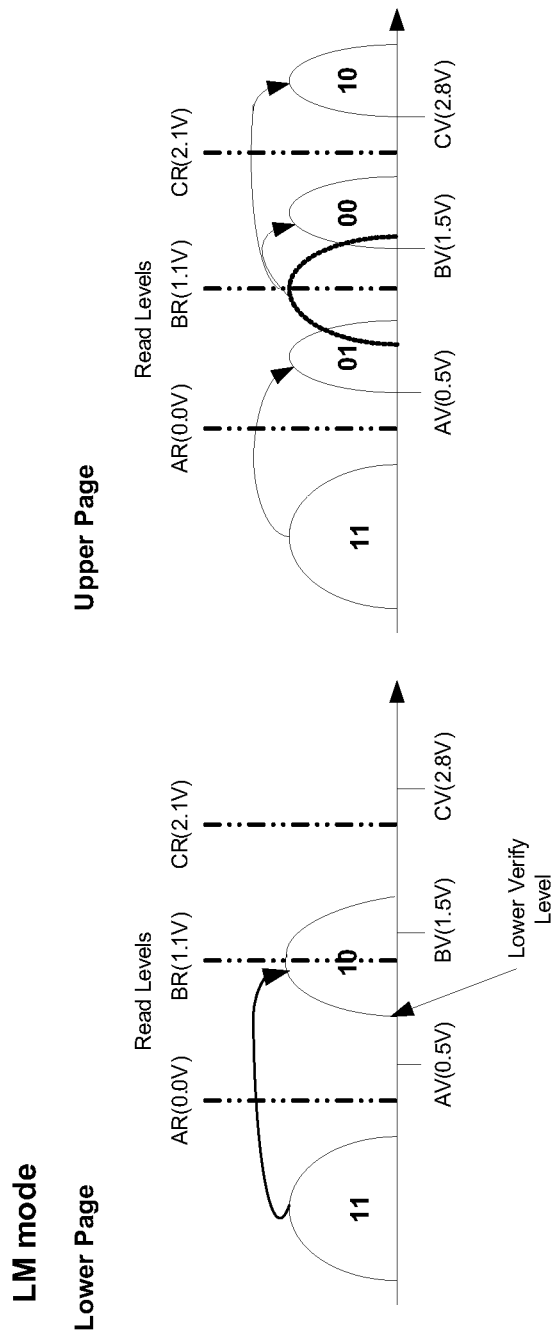
FIG. 4b illustrates charge levels in a MLC memory operated to store two bits of data in a memory cell.

FIG. 4b illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 5:
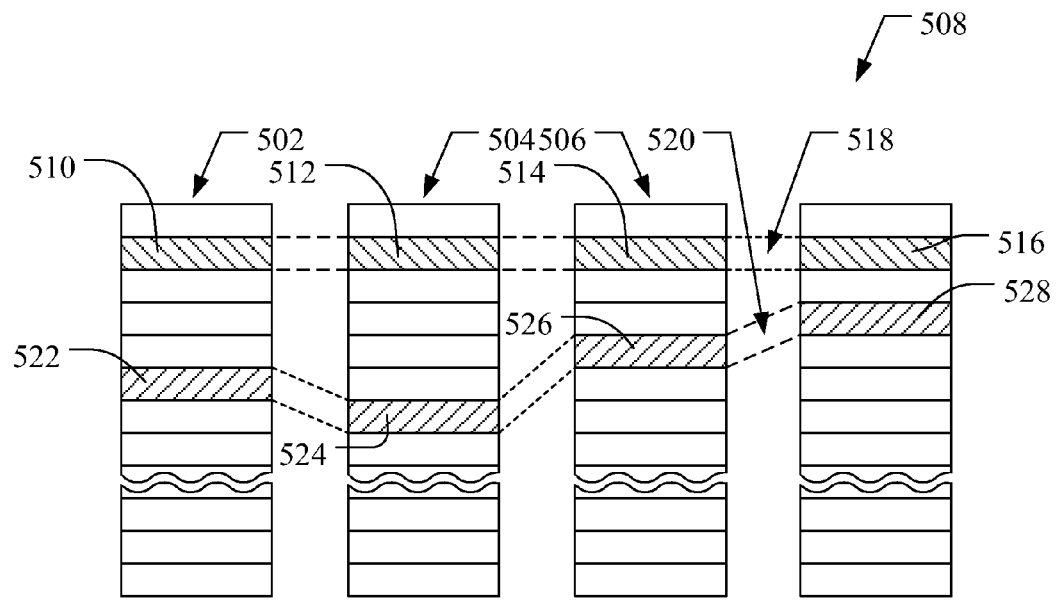
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the storage module can be operated with the ability to dynamically form metablocks of any or all of one, two or three blocks in different planes. This allows the size of the metablock to be more closely matched with the amount of data available for storage in one programming operation.

Figure 6:
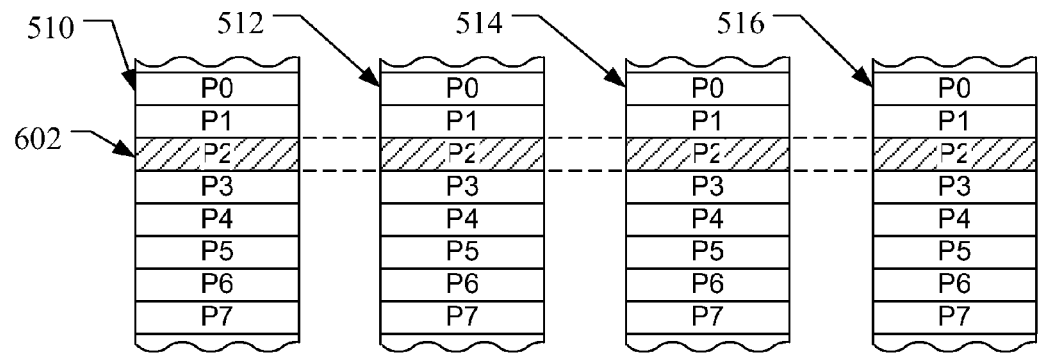
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the storage module operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks.

The flash management layer in the controller firmware of the memory card may choose to allocate memory in terms of allocation units called logical groups. Writes that are less than a logical group size will result in the controller copying valid data stored at an original physical location to a new physical location in addition to the controller writing incoming data. This overhead decreases performance and endurance of the memory. In order to minimize this overhead, a group of memory is used as update blocks. An update block is usually a memory of better endurance than the data blocks. i.e, if the data blocks have MLC memory, the update blocks have SLC memory. Writes that are less than a logical group may result in the controller directing data into the update blocks, and after consolidation, the controller may copy data at a later point in time from the update block to one or more program data blocks. The controller performs these actions based on the fact that the update blocks are more durable and there is more possibility of collecting the entire logical group of data in the update blocks before writing into the data blocks, thus reducing overhead in the MLC memory. It is also more desirable to retain frequently written data blocks in the update block for similar reasons.

As mentioned above, storage modules described in the present disclosure provide the ability to identify and compress rarely used data. As described in more detail below, a storage module may generally monitor access of a memory within the storage module and identify when a host or the storage controller itself accesses data stored at the memory of the storage module. The storage controller utilizes a timestamp such as an access counter and stores a value of the access counter at the time of identified access of data stored at a particular portion of the memory.

The storage controller increases the access counter based on factors such as a number of times the host or the storage controller accesses the memory in general and/or a number of times the storage module enters or exits a hibernation state or a power off state. At a later time, the storage controller may compare a current value of the access counter with the stored associations between data stored at particular portions of the memory and previous access counter values to determine which portions of the memory are storing data that is rarely accessed.

When the storage controller identifies data stored at a portion of the memory that is rarely accessed, the storage controller may identify data stored at other portions of the memory that are also rarely accessed. For example, the storage controller may utilize the value of the access counter associated with the rarely accessed data to identify, based on recorded values of the access counter associated with data stored at other portions of the memory, data stored at other portions of the memory that is likely rarely accessed. The controller then compresses the identified rarely accessed data together.

Figure 7:
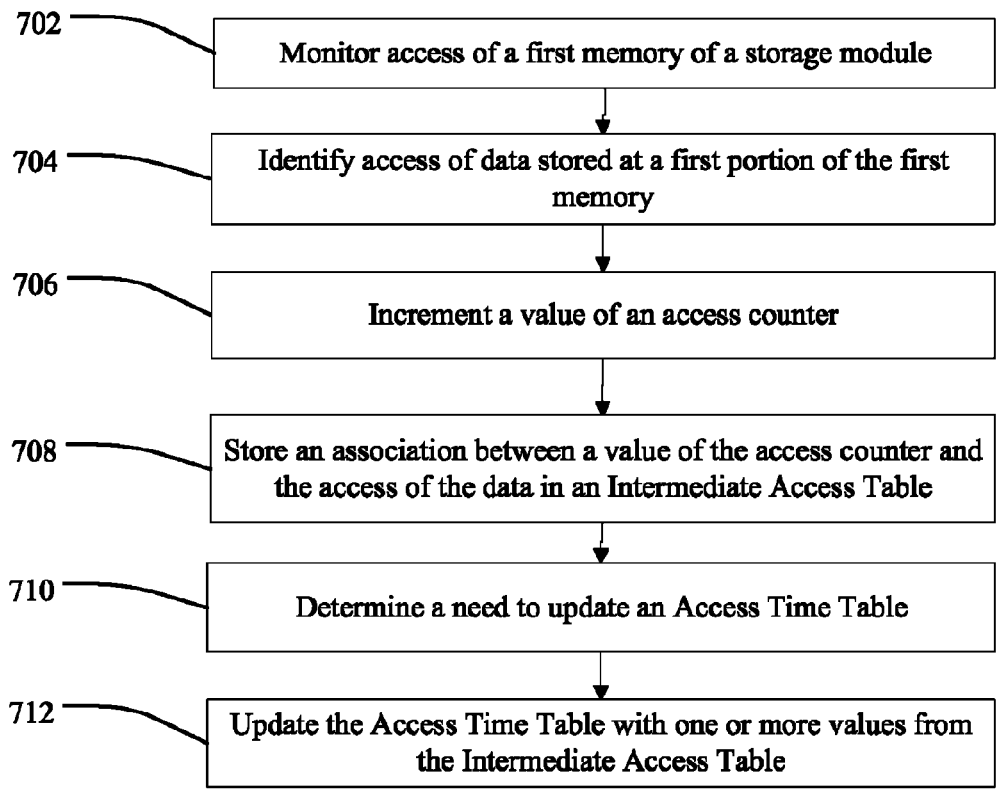
FIG. 7 is a flow chart of one implementation of a method for identifying access of data stored in a memory and associating the access with a timestamp such as an access counter.

FIG. 7 is a method of one implementation for identifying access of a memory and associating the access with a timestamp such as an access counter. At step 702, a storage controller monitors access of a first memory of the storage module. In some implementations the first memory may be non-volatile memory such as a flash memory.

Examples of an access may include a host reading data stored at the first memory, a host writing data to the first memory, the storage controller reading data stored at the first memory absent instructions from a host, and/or the storage controller writing data to the first memory absent instructions from a host. In some implementations, the storage controller may only consider the host or the storage controller writing data to the non-volatile memory to be an access and may not consider the host or the storage controller reading data from the non-volatile memory to be an access. In other implementations, the storage controller only considers a host reading data stored at the first memory or the host writing data to the first memory to be an access.

At step 704, the storage controller identifies an access of data stored at a first portion of first memory. A portion of the first memory may be a logical block address (LBA) of a memory, a page of memory, a block of memory, or any other division of memory that the storage controller is configured to operate with.

At step 706, the storage controller may increment a value of an access counter, and at step 708, the storage controller stores an association between a value of an access counter of the storage module and the data stored at the first portion of the first memory.

As mentioned above, the storage controller may utilize an access counter to record when data is accessed. The storage controller may increase a value of the access counter each time a host or the storage controller itself accesses the data; each time the storage module enters a hibernation state or a power off state; each time the storage module exits a hibernation state or a power off state; each powercycle (a time period between exiting and entering a hibernation state or a power off state) that a host or the storage controller access data; and/or any other point in time or action by the host or storage controller that would allow the storage controller to determine when data stored in a memory is aging.

In some implementations, the storage controller stores the association between the value of the access counter of the storage module and the data stored at the first portion of the first memory in an Intermediate Access Table. A second memory, such as a RAM of the storage controller, may store the Intermediate Access Table and the storage controller may periodically update an Access Time Table stored in the first memory with values from the Intermediate Access Table.

Continuing with this example, at step 708, the storage controller may store in an Intermediate Access Table stored in the second memory the association between a value of an access counter of the storage module and the data stored at the first portion of the first memory.

At step 710, the storage controller determines a need to update an Access Time Table stored in the first memory with values from the Intermediate Access Table stored in the second memory. For example, the storage controller may determine a need to update the Access Time Table with entries from the Intermediate Access Table each time the storage module receives a sleep/hibernation notification or a power off notification from a host instructing the storage module to enter a hibernation state or a power off state; after a defined number of changes in the Intermediate Access Table; after the value of the access counter increases by a defined amount since a last update of the Access Time Table; and/or any other factor that indicates to the storage controller that the Access Time Table stored in the first memory should be updated with values stored in that Intermediate Access Table stored in the second memory.

At step 712, the storage controller updates the Access Time Table stored in the first memory with one or more values from the Intermediate Access Table stored in the second memory. It will be appreciated by those of skill in the art that the storage controller may utilize two memories, such as RAM to store the Intermediate Access Table and non-volatile flash memory to store the Access Time Table, in order to increase performance of the storage module and reduce wear on the first memory.

The above-described process is repeated with the storage controller recording associations between an access counter and an access of the first memory. Periodically, the storage controller reviews the stored associations to identify rarely used data based on the access counter associated with the last access of specific portions of memory.

Figure 8:
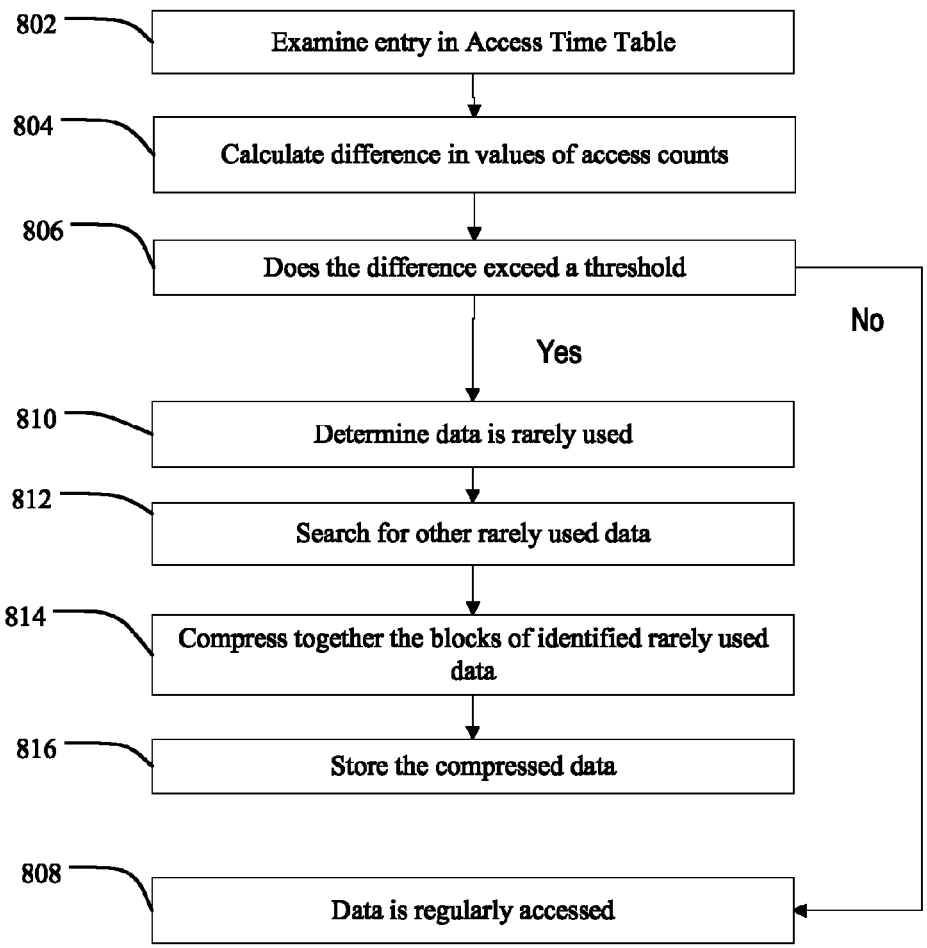
FIG. 8 is a flow chart of one implementation of a method for identifying and compressing rarely used data.

FIG. 8 is a flow chart of one implementation of a method for identifying and compressing rarely used data. Continuing with the example above, at step 802, the storage controller examines an entry in an Access Time Table associated with data stored at a portion of memory, and step 804, the storage controller calculates a difference between a current value of an access counter and a value of the access counter that is associated with a most recent access of data stored at the portion of a memory.

At step 806, the storage controller determines whether the calculated difference exceeds a threshold that is set to indicate that data is rarely accessed (also known in the art as cold data). If the calculated difference does not exceed the threshold, the storage controller 808 determines that the data is regularly accessed. However, if the calculated difference does exceed the threshold, the storage controller determines at step 810 that the data is rarely accessed and that the probability that the host or storage controller will access the data in the future is low.

After determining that the data is rarely accessed, at step 812, the storage controller may search the Access Time Table for data stored at other portions of the memory whose most recent access is associated with a value of an access counter that is within a defined range of the value of the access counter that is associated with the data that the storage controller has already determined is rarely accessed.

For example, if the access counter is defined in terms of counting power cycles where data stored in the memory is accessed, the storage controller may determine that data that was last accessed 3,000 power cycles ago is likely rarely accessed data. Further, the storage controller may determine that any data that was last accessed within 50 power cycles of the data that the storage controller has already determined to be rarely accessed data is also rarely accessed data and can be compressed together.

In another example, if the access counter is defined in terms of each time the host accesses data in the memory, the storage controller may determine that data that was last accessed 30,000,000 accesses ago is likely rarely accessed data. Further, the storage controller may determine that any data that was last accessed within 5,000 accesses of the data that the storage controller has already determined to be rarely accessed data is also rarely accessed data and can be compressed together.

At step 814, the storage controller compresses together the data stored in the portion of memory identified at step 810 and the data stored in the one or more portions of memory identified at step 812. At step 816, the storage controller stores the compressed data in the memory.

In some implementations, the storage controller may limit a size of the compressed data stored at step 816. For example, the storage controller may define a cap such that a maximum size of the compressed data can be 1 MB. Accordingly, if the size of the data that can be compressed together exceeds 1 MB, the controller would divide the data into two or more chunks of no more than 1 MB and compress each chuck separately.

FIGS. 1-8 illustrate systems and methods for identifying and compressing rarely used data. As discussed above, the described storage modules may monitor a host and/or a storage controller of the storage module accessing data stored in the storage module and identify rarely used data based on factors such as a number of times the host or the storage controller accesses data stored in the storage module without accessing data stored at a particular portion of the memory or a number of times a storage module exits and enters a hibernation state or a power off state (a power cycle) without the host or the storage controller accessing data stored at a particular portion of the memory.

When the storage module identifies rarely accessed data, the storage module may identify one or more blocks of data stored at other portions of the memory that are rarely used. The storage controller may identify the one or more blocks of data stored at other locations that are rarely used by identifying data stored at memory locations that were last accessed at approximately the same time as the originally identified rarely used data.

It is intended that the foregoing detailed description be regarded as illustrative rather than limiting, and that it be understood that it is the following claims, including all equivalents, that are intended to define the spirit and scope of this invention.

For example, in the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The invention claimed is:

1. A method for managing data stored in a storage module, the method comprising:
performing the following in a storage controller of a storage module having a first memory in operative communication with the storage controller:
storing in an Intermediate Access Table that is stored in a second memory of the storage module, an association between an access of data stored at the first portion of the first memory and a first value of an access counter that is associated with the storage module;
determining, based on the stored first value of the access counter and a second value of the access counter, that an age of the data stored at the first portion of the first memory exceeds a threshold;
identifying data stored at a second portion of the first memory that is associated with a third value of the access counter, where the third value of the access counter is within a defined range of the first value of the access counter;
compressing together at least the data stored at the first portion of the first memory and the data stored at the second portion of the first memory; and
storing in the first memory the compressed data of at least the data stored at the first portion of the first memory and the data stored at the second portion of the first memory; and
updating an Access Time Table stored in the first memory with the association between the access of the data stored at first portion of the first memory and the first value of the access counter that is stored in the Intermediate Access Table stored in the second memory;
wherein the first memory comprises a silicon substrate and a plurality of memory cells forming at least two memory layers vertically disposed with respect to each other to form a monolithic three dimensional structure, wherein at least one memory layer is vertically disposed with respect to the silicon substrate.

2. The method of claim 1, further comprising:
updating the access counter associated with the storage module each time an access of data stored in the first memory is identified.

3. The method of claim 2, wherein the access comprises reading data stored in the first memory.

4. The method of claim 2, wherein the access comprises writing data to the first memory.

5. The method of claim 1, further comprising:
after receiving one of a power off notification or a sleep notification from a host associated with the storage module, updating the access counter associated with the storage module prior to the storage module entering a hibernation state or a power off state.

6. The method of claim 1, wherein the second memory is random access memory.

7. The method of claim 1, wherein the Access Time Table stored in the first memory is updated prior to the storage module entering a hibernation state or a power off state.

8. The method of claim 1, wherein the controller is on the same substrate as the memory cells.

9. The method of claim 1, wherein compressing together at least the data stored at the first portion of the first memory and the data stored at the second portion of the first memory comprises:
determining whether a total amount of data to be compressed exceeds a cap;
in response to determining that the total amount of data to be compressed exceeds the cap:
breaking the data to be compressed into two or more data chunks, where an amount of data within each data chunk of the two or more data chunks does not exceed the cap; and
compressing the data of each of the two or more data chunks for storage in the first memory.

10. A storage module, comprising:
   a first memory configured to store an Access Time Table;
   a second memory configured to store an Intermediate Access Table; and
   a storage controller in operative communication with the first memory and the second memory, wherein the storage controller is configured to:
   identify an access of data stored at a first portion of the first memory;
   store in the Intermediate Access Table an association between the access of the data stored at the first portion of the first memory and a first value of an access counter that is associated with the storage module;
   determine, based on the stored first value of the access counter and a second value of the access counter, that an age of the data stored at the first portion of the first memory exceeds a threshold;
   identify data stored at a second portion of the first memory that is associated with a third value of the access counter, where the third value of the access counter is within a defined deter-mined range of the first value of the access counter;
   compress together at least the data stored at the first portion of the first memory and the data stored at the second portion of the first memory; and
   store in the first memory the compressed data of at least the data stored at the first portion of the first memory and the data stored at the second portion of the first memory; and
   update the Access Time Table with the association between the access of the data stored at first portion of the first memory and the first value of the access counter that is stored in the Intermediate Access Table;
   wherein the first memory comprises a silicon substrate and a plurality of memory cells forming at least two memory layers vertically disposed with respect to each other to form a monolithic three dimensional structure, wherein at least one memory layer is vertically disposed with respect to the silicon substrate.

11. The storage module of claim 10, wherein the storage controller is further configured to:
   update the access counter associated with the storage module each time an access of data stored in the first memory is identified.

12. The storage module of claim 10, wherein the storage controller is further configured to:
   after receiving one of a power off notification or a sleep notification from a host associated with the storage module, update the access counter associated with the storage module prior to the storage module entering a hibernation state or a power off state.

13. The storage module of claim 10, wherein the second memory is random access memory.

14. The storage module of claim 10, wherein the storage controller is configured to update the Access Time Table stored in the first memory prior to the storage module entering a hibernation state or a power off state.

15. The storage module of claim 10, wherein the storage controller is on the same substrate as the memory cells.

16. The storage module of claim 10, wherein the storage module is embedded in a host.

17. The storage module of claim 10, wherein the storage module is removably connectable to a host.

18. The storage module of claim 10, wherein to compress together at least the data stored at the first portion of the first memory and the data stored at the second portion of the first memory, the storage controller is further configured to:
   determine whether a total amount of data to be compressed exceeds a cap;
   in response to a determination that the total amount of data to be compressed exceeds the cap:
      break the data to be compressed into two or more data chunks, where an amount of data within each data chunk of the two or more data chunks does not exceed the cap; and
      compress the data of each of the two or more data chunks for storage in the first memory.

19. A method for managing data stored in a storage module, the method comprising:
   performing the following in a storage controller of a storage module having a first memory in operative communication with the storage controller:
   storing in a table that is stored in a second memory of the storage module, a first value of a counter associated with the storage module in response to a storage controller performing one of reading data from a first portion of the first memory or writing data to the first portion of the first memory;
   determining, based on the first value of the counter that is stored and a current value of the counter, that an age of the data stored at the first portion of the first memory exceeds a threshold;
   identifying a second value of the counter that is within a range of the first value of the counter, where the second value of the counter was stored in response to the storage controller performing one of reading data from a second portion of the first memory or writing data to the second portion of the first memory;
   compressing together at least the data stored at the first portion of the first memory and the data stored at the second portion of the first memory; and
   storing in the first memory the compressed data of at least the data stored at the first portion of the first memory and the data stored at the second portion of the first memory; and
   updating a table stored in the first memory with the first value of the counter stored in the table that is stored in the second memory, the table stored in the first memory associating the first value of the counter with one of reading data from a first portion of the first memory or writing data to the first portion of the first memory;
   wherein the first memory comprises a silicon substrate and a plurality of memory cells forming at least two memory layers vertically disposed with respect to each other to form a monolithic three dimensional structure, wherein at least one memory layer is vertically disposed with respect to the silicon substrate.

* * * * *

UNITED STATES PATENT AND TRADEMARK OFFICE
CERTIFICATE OF CORRECTION

| | | |
|---|---|---|
| PATENT NO. | : 9,110,857 B1 | Page 1 of 1 |
| APPLICATION NO. | : 14/288992 | |
| DATED | : August 18, 2015 | |
| INVENTOR(S) | : Tal Rostoker et al. | |

It is certified that error appears in the above-identified patent and that said Letters Patent is hereby corrected as shown below:

In the Claims

In column 13, claim 10, line 21, before "range of the first value" replace "deter-mined" with --determined--.

Signed and Sealed this
Twenty-second Day of March, 2016

Michelle K. Lee
*Director of the United States Patent and Trademark Office*